(12) United States Patent
Ryu

(10) Patent No.: US 10,595,426 B2
(45) Date of Patent: Mar. 17, 2020

(54) DISPLAY DEVICE

(71) Applicant: LG ELECTRONICS INC., Seoul (KR)

(72) Inventor: Seunghak Ryu, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/816,836

(22) Filed: Nov. 17, 2017

(65) Prior Publication Data

US 2018/0168060 A1 Jun. 14, 2018

(30) Foreign Application Priority Data

Dec. 12, 2016 (KR) .................. 10-2016-0168588

(51) Int. Cl.
| | |
|---|---|
| *H05K 5/00* | (2006.01) |
| *H05K 7/00* | (2006.01) |
| *H05K 7/02* | (2006.01) |
| *G02F 1/1333* | (2006.01) |
| *H04N 5/64* | (2006.01) |

(Continued)

(52) U.S. Cl.
CPC ........... *H05K 7/02* (2013.01); *G02F 1/13452* (2013.01); *G02F 1/133308* (2013.01); *H04N 5/64* (2013.01); *H05K 1/141* (2013.01); *H05K 1/147* (2013.01); *H05K 5/0017* (2013.01); *H05K 5/02* (2013.01); *H01L 27/3244* (2013.01)

(58) Field of Classification Search
CPC .................................................. G06F 1/1605
USPC .................................................. 361/679.21
See application file for complete search history.

(56) References Cited

U.S. PATENT DOCUMENTS 6,307,530 B1 10/2001 Cho
2010/0302494 A1 12/2010 Lee et al.
(Continued)

FOREIGN PATENT DOCUMENTS

CN 101900897 12/2010
CN 102122090 7/2011
(Continued)

OTHER PUBLICATIONS

European Patent Office Application Serial No. 17205754.9, Search Report dated Mar. 26, 2018, 7 pages.
(Continued)

*Primary Examiner* — Jerry Wu
(74) *Attorney, Agent, or Firm* — Lee, Hong, Degerman, Kang & Waimey PC

(57) ABSTRACT

There is disclosed a display device comprising a display unit comprising a display panel; an AV box configured to form an electric control unit; and a first cable configured to electrically connect the display unit with the AV box, wherein the display unit comprises a source PCB provided in an upper end of a rear surface of the display panel; a second cable configured to connect the upper end of the rear surface of the display panel with an upper end of the source PCB; an interface board provided in a lower end of the source PCB and electrically connected with the source PCB; a third cable configured to connect one side of the interface board with the source PCB; and a module cover configured to cover the rear surface of the display panel, and the first cable is configured to connect the other side of the interface board with the AV box.

12 Claims, 16 Drawing Sheets

(51) Int. Cl.
  *H05K 1/14* (2006.01)
  *G02F 1/1345* (2006.01)
  *H05K 5/02* (2006.01)
  *H01L 27/32* (2006.01)

(56) References Cited

U.S. PATENT DOCUMENTS

2011/0116218 A1* 5/2011 Choi ..................... H04N 5/64
                                                361/679.01
2013/0135528 A1* 5/2013 Nicu .................... H04N 5/4401
                                                348/552
2013/0321715 A1* 12/2013 Millson ................ F16M 11/048
                                                348/739

FOREIGN PATENT DOCUMENTS

| EP | 1455377 | 9/2004 |
| EP | 2343958 | 7/2011 |
| KR | 1020130077090 | 7/2013 |

OTHER PUBLICATIONS

State Intellectual Property Office of the People's Republic of China Application Serial No. 201711317264.X, Office Action dated Aug. 28, 2019, 22 pages.

* cited by examiner (a)

(b)

DISPLAY DEVICE

CROSS-REFERENCE TO RELATED APPLICATIONS

Pursuant to 35 U.S.C. § 119(a), this application claims priority to Korean Patent Application No. 10-2016-0168588 filed on Dec. 12, 2016 in Korea, the entire contents of which is hereby incorporated by reference in its entirety.

BACKGROUND OF THE DISCLOSURE

Field of the Disclosure

Embodiments of the present disclosure relate to an ultra-thin display device.

Background of the Disclosure

Efforts to maximize an output region of a display device and minimize the thickness of the display device have been continued. As the type of the display device is changed from a CRT type into an OLED (Organic Light Emitting Diode) or LCD (Liquid Crystal Diode) type, the thickness of the display device has been decreased. Efforts to lessen the thickness of the OLED or LCD display device are being also continued.

A wall-mount display device can be realized by the thickness decreasing and weight lightening of the device. The wall-mount display device is mounted on the wall so as to somewhat release restriction on the mount height of the display device.

However, even the wall-mount display device cannot be in complete contact with the wall. The awareness of difference between the wall and the display region of the display device fails to be overcome and spatial arrangement is restricted because of the projected display region.

Especially, a display device for a television configured to receive a broadcasting signal transmitted from a broadcasting station and output contents tends to requires additional components. For that, the volume of the display device has to be increased inevitably.

To solve such a disadvantage, an ultra-thin display device including a display unit which may be installed in close contact with the wall has been developed. The ultra-thin display device independently includes the display unit in which the least components for outputting an image on a display panel are loaded and an AV box in which the other components are loaded.

Such the ultra-thin display device may be easily realized by the OLED display device which requires no auxiliary backlight unit.

However, there are trials and efforts to overcome the confines of the components arrangement and structure of the ultra-thin display device and minimize the thickness of the ultra-thin display device.

SUMMARY OF THE DISCLOSURE

Accordingly, an object of the present invention is to address the above-noted and other problems and the problem of the thickness of the ultra-thin display device.

Embodiments of the present disclosure may provide a display device comprising a display unit comprising a display panel; an AV box configured to form an electric control unit; and a first cable configured to electrically connect the display unit with the AV box, wherein the display unit comprises a source PCB provided in an upper end of a rear surface of the display panel; a second cable configured to connect the upper end of the rear surface of the display panel with an upper end of the source PCB; an interface board provided in a lower end of the source PCB and electrically connected with the source PCB; a third cable configured to connect one side of the interface board with the source PCB; and a module cover configured to cover the rear surface of the display panel, and the first cable is configured to connect the other side of the interface board with the AV box.

A hole may be formed in one area of the module cover, and the first cable may be drawn out from a lower end of the display unit via the hole to be connected with the AV box.

The first cable may not be overlapped with the source PCB in a direction along the thickness of the display unit.

The first cable may comprise an area with a first width and a longitudinally extended line from the area of the first cable, with the first width, is overlapped with the source PCB in a direction along the thickness of the display unit.

The second cable may be provided as COF (Chip On Film).

The first cable may not be overlapped with the second cable in a direction along the thickness of the display unit.

One side of the second cable may be connected with an upper end of the display panel and a predetermined region of the second cable may be wound to connect the other side with the source PCB.

The display panel may comprise a transparent substrate; a first electrode provided in a rear surface of the transparent substrate; an organic light emitting layer provided in a rear surface of the first electrode; and a lower electrode provided in a rear surface of the organic light emitting layer, wherein the second cable is coupled to the rear surface of the transparent substrate.

The display panel may further comprise a metal sheet provided in the rearmost surface; and an adhesive material disposed between the source PCB and a rear surface of the metal sheet.

An inner surface of the module cover may have a recessed area corresponding toe the source PCB, the second cable and the interface board.

The module cover may have a recessed area recessed from a rear surface forwardly, corresponding to the first cable.

The thickness of the display unit may become reduced more and more toward the lower end.

An outer surface of the module cover may have an inclined surface inclined with respect to a front surface of the display panel.

An outer surface of the module cover may have a step-like shaped area recessed inwardly toward the lower end.

The AV box may comprise a controller; a main board in which the controller is loaded; and a power supply unit configured to supply an electric power.

The display device may further comprise a rail provided in a rear surface of the display panel and guide vertical movement of the interface board, wherein the first cable is movable into or out from the display unit by the movement of the interface board.

The ultra-thin display device has following effects.

First of all, the display device is capable of minimizing the thickness of the support portion while realizing the swivel structure.

Furthermore, the display device is cable of dispersing the heat generated in the display unit.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings, which are given by illustration only, and thus are not limitative of the present invention, and wherein.

DESCRIPTION OF SPECIFIC EMBODIMENTS

Figure 1:
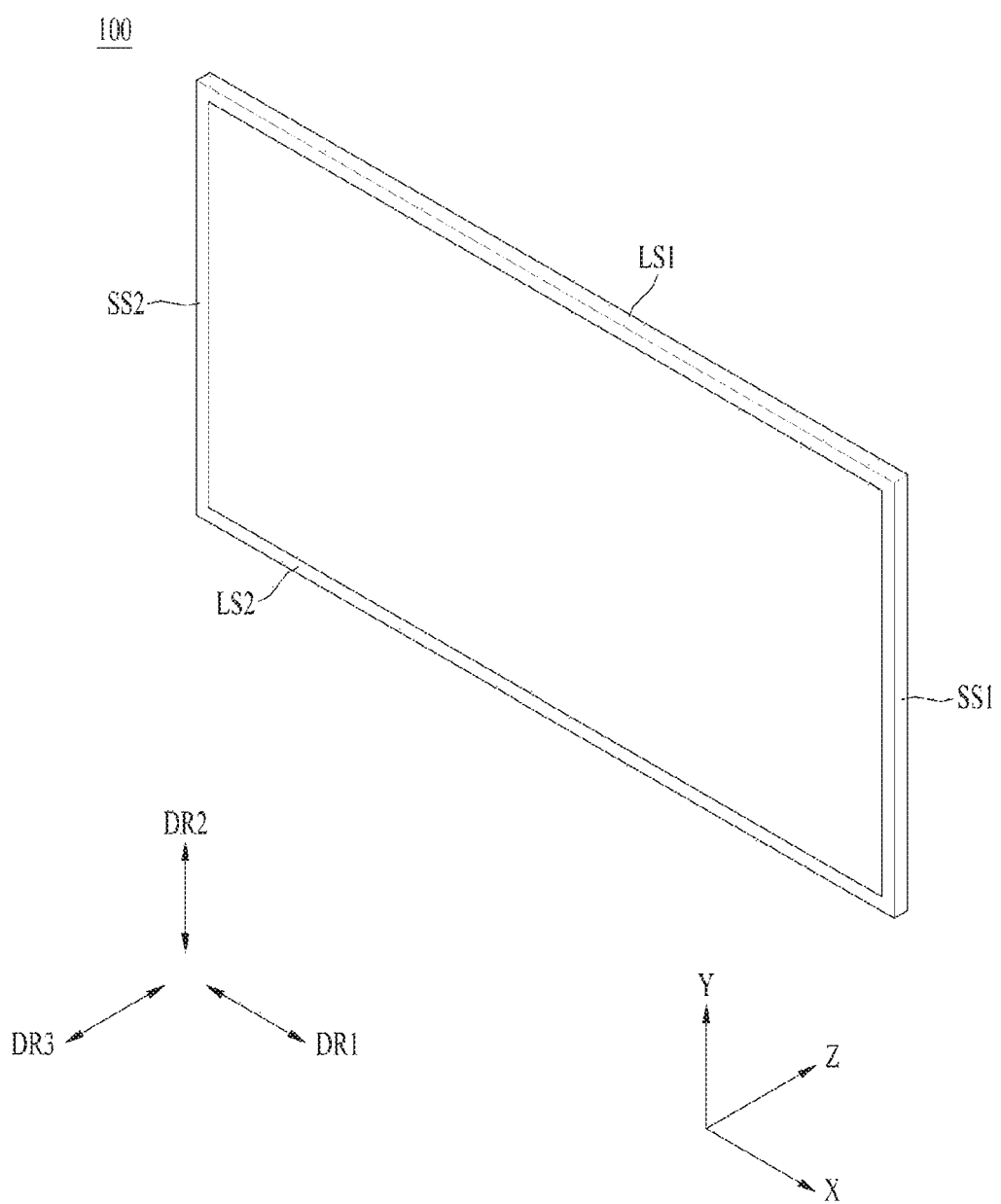
FIG. 1 is a diagram illustrating a structure of a display unit related to the present disclosure.

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

Efforts to maximize an output region of a display device and minimize the thickness of the display device have been continued. As the type of the display device is changed from a CRT type into an OLED (Organic Light Emitting Diode) or LCD (Liquid Crystal Diode) type, the thickness of the display device has been decreased. Efforts to lessen the thickness of the OLED or LCD display device are being also continued.

A wall-mount display device can be realized by the thickness decreasing and weight lightening of the device. The wall-mount display device is mounted on the wall so as to somewhat release restriction on the mount height of the display device.

However, even the wall-mount display device cannot be in complete contact with the wall. The awareness of difference between the wall and the display region of the display device fails to be overcome and spatial arrangement is restricted because of the projected display region.

Especially, a display device for a television configured to receive a broadcasting signal transmitted from a broadcasting station and output contents tends to requires additional components. For that, the volume of the display device has to be increased inevitably.

To solve such a disadvantage, an ultra-thin display device including a display unit which may be installed in close contact with the wall has been developed. The ultra-thin display device independently includes the display unit in which the least components for outputting an image on a display panel are loaded and an AV box in which the other components are loaded.

Such the ultra-thin display device may be easily realized by the OLED display device which requires no auxiliary backlight unit.

However, there are trials and efforts to overcome the confines of the components arrangement and structure of the ultra-thin display device and minimize the thickness of the ultra-thin display device.

FIG. 1 is a diagram illustrating a structure of a display unit 100 related to the present disclosure.

The display unit 100 may be defined as one body directly including a display panel 110.

The display unit 100 may include a first long side (LS1); a second long side (LS2), a first short side (SS1) adjacent to the LS1 and LS2; and a second short side (SS2) which is opposite to SS1.

In this instance, SS1 may refer to a first side area and SS2 refer to a second side area opposite to the first side area. LS1 may refer to a third side area located between the first and second side areas, adjacent to them. LS2 may refer to a fourth side area located between the first and second side areas, opposite to the third side area.

For description sake, LS1 and LS2 are longer than SS1 and SS2. However, LS1 and LS2 may be almost equally long as SS1 and SS2.

Hereinafter, a first direction (DR1) may be a direction parallel with the long sides of the display unit 100 (LS1 and LS2). A second direction (DR2) may be a direction parallel with the short sides (SS1 and SS2) of the display unit 100.

A third direction (DR3) may be a direction perpendicular to the first direction (DR1) and/or the second direction (DR2).

DR1 and DR2 may be collectively called the horizontal directions.

DR3 may be called the vertical direction.

Figure 2:
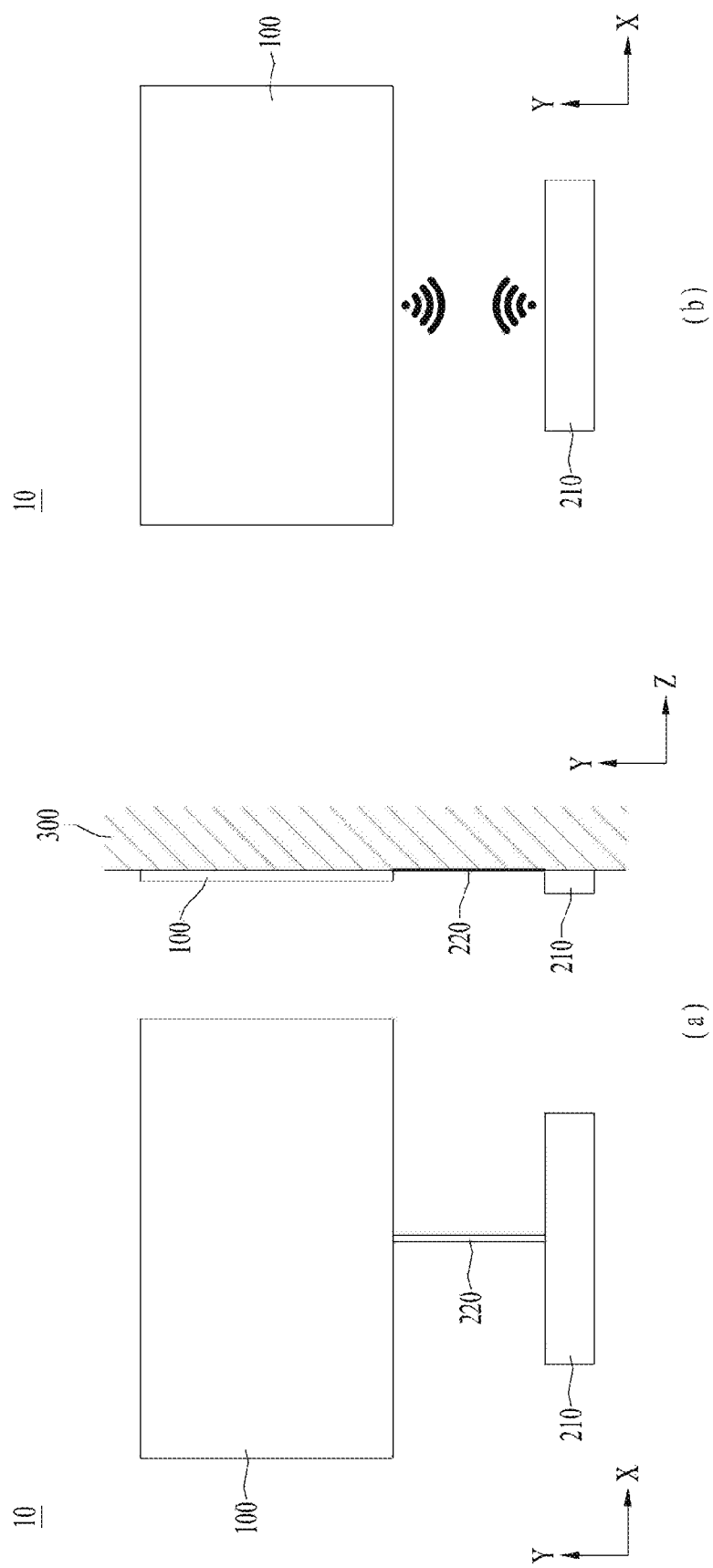
FIG. 2 is a diagram illustrating one embodiment of a display device in accordance with the present disclosure.

FIG. 2 is a diagram illustrating one embodiment of a display device 10 in accordance with the present disclosure.

As mentioned above, the display device 10 may independently include the display unit 100 and the AV box 210. The display unit 100 and the AV box 210 may exchange or transceive electrical signals.

The AV box 210 may load electronic components for driving the display device therein. The electronic components may include a battery functioning as a power supply unit; a main board; a wireless communication module; and a speaker.

The physical separation of the display unit 100 and the AV box 210 may result in the display unit 100 and the AV box 210 being spaced a preset distance from each other. the AV box 210 may be mounted on the floor and the display unit 100 may be mounted or attached to the wall 300, so that a user can focus more on an output region of the display unit 100.

The display unit 100 and the AV box 210 may transceive signals via wire or wirelessly.

When the display unit 100 is connected with the AV box 210 via a wire as shown in FIG. 2 (a), the wire using configuration is defined as a first cable 220. Such the connection will be described in detail later.

Alternatively, the display unit 100 and the AV box 210 may tranceive signals with each other wirelessly as shown in FIG. 2 (b).

Figure 3:
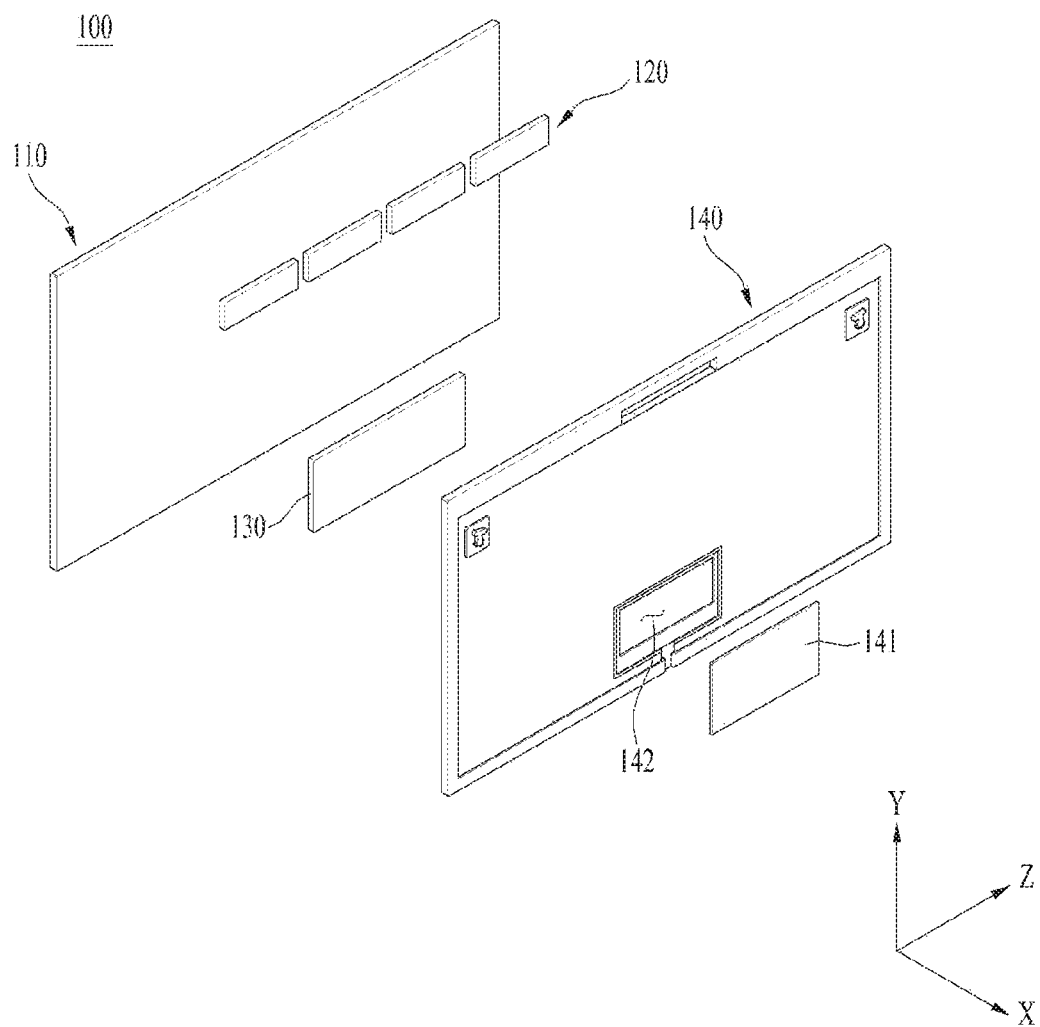
FIG. 3 is an exploded perspective diagram illustrating the display unit in accordance with the present disclosure.

FIG. 3 is an exploded perspective diagram illustrating the display unit 100 in accordance with the present disclosure.

The display panel 110 is provided on a front surface of the display unit 100 and configured to display an image. The display panel 110 is controlled to divide the image into a plurality of pixels which emit lights with hue saturation intensity, respectively, to output the image.

As mentioned above, the display panel 110 may be a rectangular flat display. As one alternative example, it may be a curved display.

The display panel 110 may have a different configuration according as whether the display device 10 is the OLED type or LCD type.

The display panel 110 may include a metal sheet 116 provided in the rearmost side. The display panel provided only as it is has a low strength level enough to cause panel bending and damage and the metal sheet 116 is employed to supplement or compensate the strength.

A source PCB 120 may be provided in a rear surface of the display. Signal wires for transmitting digital video data and timing control signals of the main board or interface board 130 may be located in the source PCB 120.

The interface board 130 has a reception interface IC loaded therein to receive a signal from a transmission interface IC provided in the AV box 210 (shown in FIG. 2) and transmit the signal to the source PCB 120.

The interface board 130 has a reception interface IC loaded therein to receive a signal from a transmission interface IC provided in the AV box 220 and transmit the signal to the source PCB 120.

The module cover 140 is provided to cover the rear surface of the display panel 110 and directly attached to the display panel 110. The module cover 140 may support the rear surface of the display panel 110 and define the rear exterior of the display unit 100.

More specifically, the module cover 140 may cover a rear surface of the source PCB 120. As occasion occurs, a PCB cover configured to expose the source PCB 120 may additionally cover the source PCB 120 to define the rear exterior of the display unit 100 (not shown).

Figure 4:
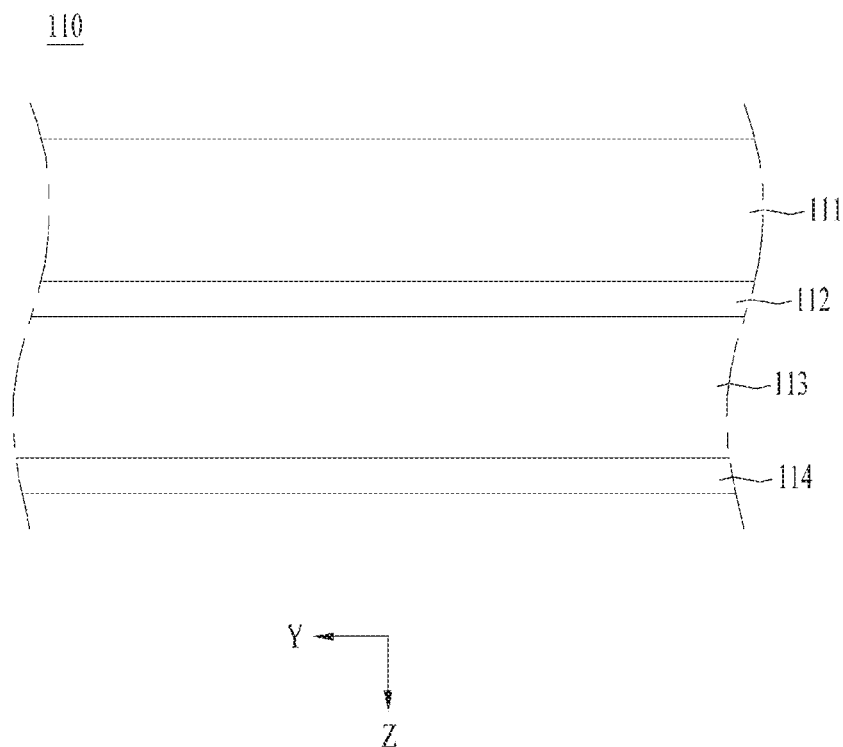
FIG. 4 is a cross sectional diagram illustrating one region of a display panel.

FIG. 4 is a cross sectional diagram illustrating one region of a display panel. 110.

The display panel 110 of the display device 10 in accordance with the present disclosure may be the OLED type display.

The display panel 110 may include a transparent substrate 111; an upper electrode 112; an organic light emitting layer 113; and a lower electrode 114. The transparent substrate 111, the upper electrode 112, the organic light emitting layer 113 and the lower electrode 114 may be formed sequentially.

The transparent substrate 11 and the upper electrode 112 may include a transparent material. The lower electrode 114 may include an opaque material. However, the embodiments of the present disclosure are not limited thereto and the may include a transparent material (for example, ITO and the like). In this instance, light may be emitted from one surface of the lower electrode 114.

When an electric voltage is applied to the upper and lower electrodes 112 and 114, the light emitted from the organic light emitting layer 113 penetrates the upper electrode 112 and the transparent substrate 111 to be radiated outside. At this time, to radiate the light emitted to the lower electrode 114 forwardly, a light shade plate may be further formed behind the lower electrode 114.

The OLED display device 10 configured as mentioned above may require no auxiliary light sources and is able to reduce the volume and weight of the display device 10. Also, the OLED display device 10 has a faster reaction speed than the LCD display device 10, so that it may have an advantage of no afterimage when displaying an image.

The metal sheet 116 disposed in the rearmost surface of the display panel 110 is not technically the component which affects the image output but a part of the display panel 110 for easy description sake.

Figure 5:
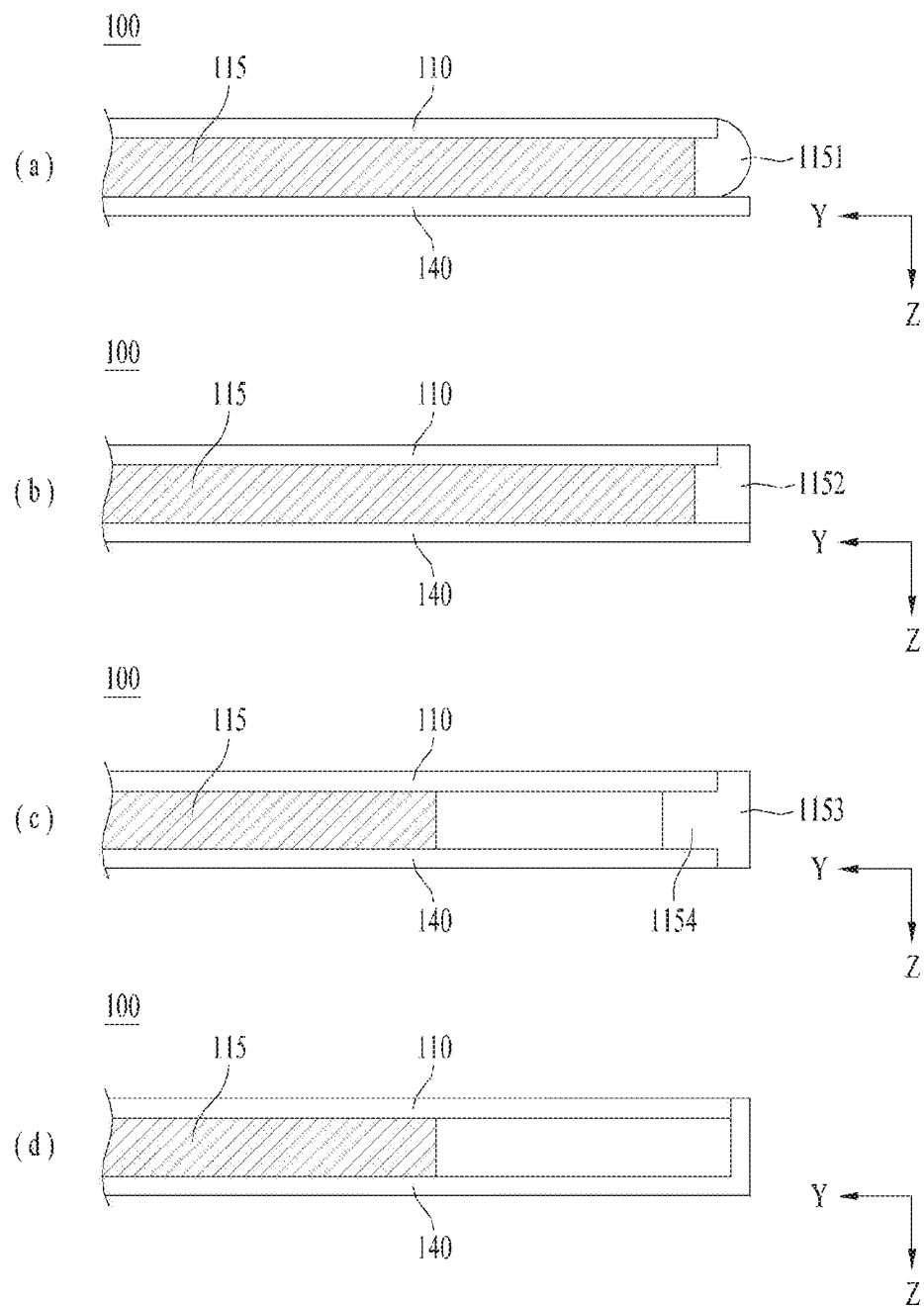
FIG. 5 is a cross sectional diagram illustrating one region of the display unit.

FIG. 5 is a cross sectional diagram illustrating one region of the display unit 100.

The display panel 110 and the module cover 140 may be attached to the display device 10 in accordance with the present disclosure by using an adhesive sheet 115. The adhesive sheet 115 may include a double adhesive tape having both sides which are adhesive.

The adhesive sheet 115 may have an auxiliary thickness so that foreign substances might come into a gap between the display panel 110 and the module cover 140. To prevent that, a sealing member 1151 may side-seal at least one side of the adhesive sheet 115 as shown in FIG. 5 (a). The sealing member 1151 may shield a predetermined region of the adhesive sheet 115 and a predetermined portion of the display panel 110 simultaneously.

As one alternative example, a frame 1152 shown in FIG. 5 (b) may be inserted in a predetermined region of the adhesive sheet 115. The frame 1152 may be in contact with some region of the adhesive sheet 115 and bending, with one end extended toward the display panel 110. Accordingly, the frame 1152 may shield the predetermined region of the display panel 110.

As another alternative example, a middle cabinet 1153 shown in FIG. 5 (c) may be disposed between the display panel 110 and the module cover 140. The middle cabinet 1153 is configured to guide the coupling position of the display panel 110. The middle cabinet 1153 may include a flange 1154 inserted between the display panel 110 and the module cover 140. A body of the middle cabinet 1153 may be configured to shield a predetermined region of the display panel 110 and a predetermined region of the module cover 140 simultaneously.

The flange 1154 of the middle cabinet 1153 may be spaced a preset distance apart from the adhesive sheet 115. Accordingly, the adhesive sheet 115 need not be located in the overall region of the display panel 110 so as to reduce the amount of the adhesive sheet 115 needed when the display device 10 is manufactured.

As a further alternative example, an edge of the module cover 140 shown in FIG. 5 (d) may bend toward the display panel 110. Since the edge of the module cover 140 is bending, a predetermined region of the adhesive sheet 115 may be shielded from the outside.

In this instance, another material need not be provided between the display panel 110 and the module cover 140. Accordingly, the manufacturing process of the display device 10 can be simplified and the production cost can be lowered. The edge of the module cover 140 may be spaced a preset distance apart from the adhesive sheet 115 so that the adhesive sheet 115 may not be provided in the entire region of the display panel 110 to reduce the amount of the adhesive sheet 115.

The structures located in a lateral surface of the adhesive sheet 115 are omitted when describing following embodiments for easy description sake. The structures located in the lateral surface of the adhesive sheet 115 may be applicable to the other following embodiments.

Figure 6:
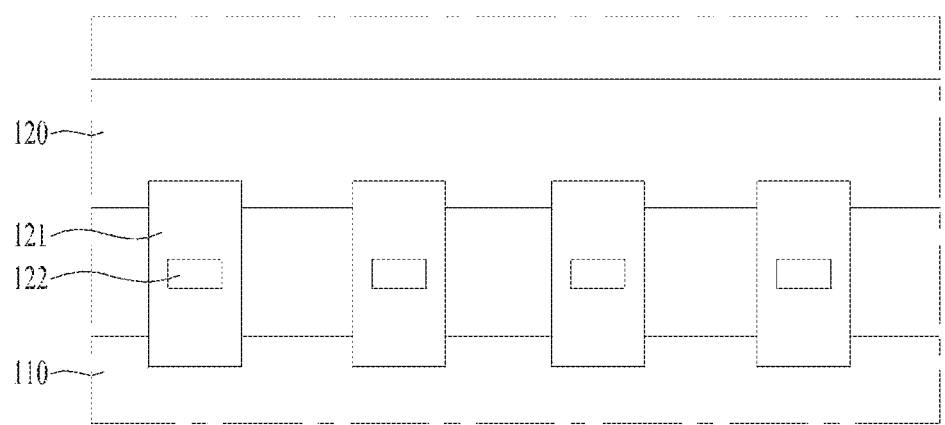
FIG. 6 is a diagram illustrating a state where a source PCB is connected with the display pane via a second cable.

FIG. 6 is a diagram illustrating a state where the source PCB 120 is connected with the display pane 110 via a second cable 121.

The source PCB 120 is electrically connected with the display panel 120 to transmit or receive a signal. The second cable 121 connects the source PCB 120 with the display panel 110. A plurality of second cables 121 may be provided to connect plural points of the source PCB 120 with plural points of the display panel 110.

The points located in the display panel 110 connected with the second cable 121 may be some of non-display area (N/A) in which no pixels are provided.

The second cable 121 may be provided as a flexible cable, for example, FPC.

The drive unit 122 may be provided on a substrate as COG (Chip On Glass) or on the second cable 121 as COF (Chip On Film)

Figure 7:
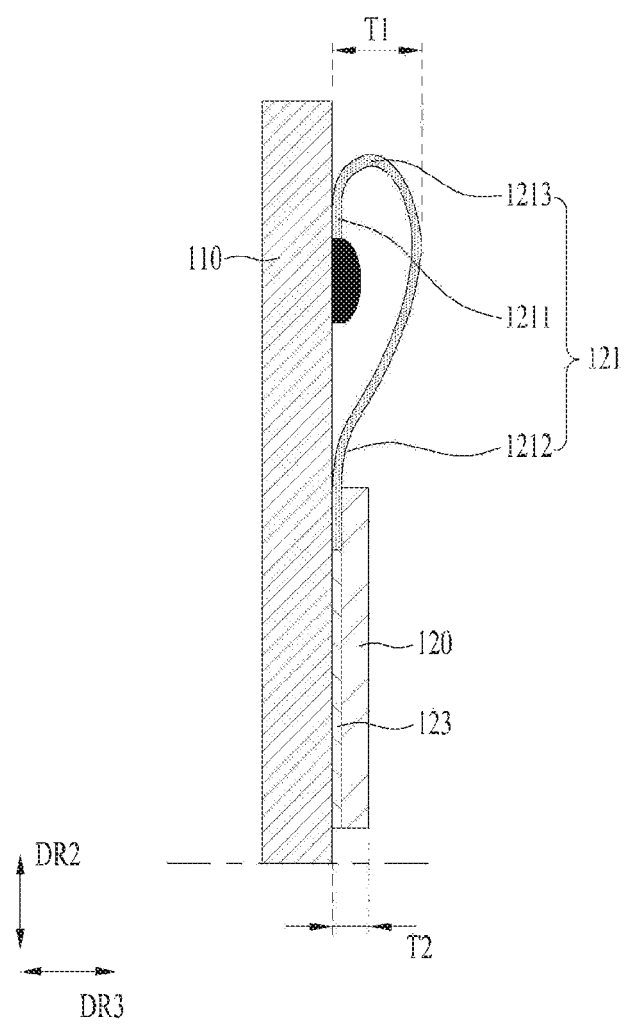
FIG. 7 is a sectional view illustrating the region where the source PCB and the display panel are connected with each other via the second cable.

FIG. 7 is a sectional view illustrating the region where the source PCB 120 and the display panel 110 are connected with each other via the second cable 121.

The source PCB 120 may be arranged on the rear surface of the display panel 110 to minimize a bezel area of the display unit 100.

It may affect the overall thickness of the display unit 100 how the source PCV 120 is located.

The source PCB 120 may be fixed to the display panel 110, especially, the metal sheet 116 by an adhesive material 123.

As occasion occurs, a holder or rest structure independently provided without the adhesive material 123 so as to prevent the second cable 121 from being damaged by the movement generated between the source PCB 120 and the display panel 110.

For explanation sake, the end of the second cable 121 connected with the display panel 110 may be defined as one side 1211 and the other end connected with the source PCB 120 as the other side 1212. An area between one region 1211 and the other region 1212 of the second cabinet 121 may be defined as a middle side 1213.

More specifically, the one side 1211 of the second cable 121 is connected with the display panel 110 from outside toward inside with respect to a second direction. The other side 1212 of the second cable 121 is also connected with the source PCB 120 from outside toward inside.

That connection facilitates at least one area of the middle side 1213 of the second cable 121 to be wounded. In other words, the second cable 121 is bending in a 'U' shape to connect the display panel 110 and the source PCB 120.

The characteristic of that connection is defined as forward bonding. The forward bonding is the connection not penetrating the other components but avoiding them, so as to result in no electrical loss. Accordingly, it is proper to use that connection in the large-inch display device 10.

The second cable 121 provided in the U-shaped forward bonding may occupy a space of a thickness (T1) with respect to a third direction, in other words, a direction along the thickness of the display unit 100. It is necessary that the width between the rear surface of the display panel 110 and an inner surface of the module cover 140 should be secured to be as large as T1 or more, because there is great concern about damage to the second cable 121 which might be caused by an external force in a direction along the width.

Alternatively, the thickness (T2) of the source PCB 120 which occupies the rear surface of the display panel 110 may be larger than the thickness (T1) of the second cable 121. In this instance, it is necessary that the width between the rear surface of the display panel 110 and the inner surface of the module cover 140 has to be secured to be as large as T2 or more.

More specifically, the thickness of the display unit 100 may be influenced by the space (T1) occupied by the second cable 121 or the space (T2) occupied by the source PCB 120. Especially, the forward bonding may be influenced more by the space (T1) occupied by the second cable 121.

Figure 8:
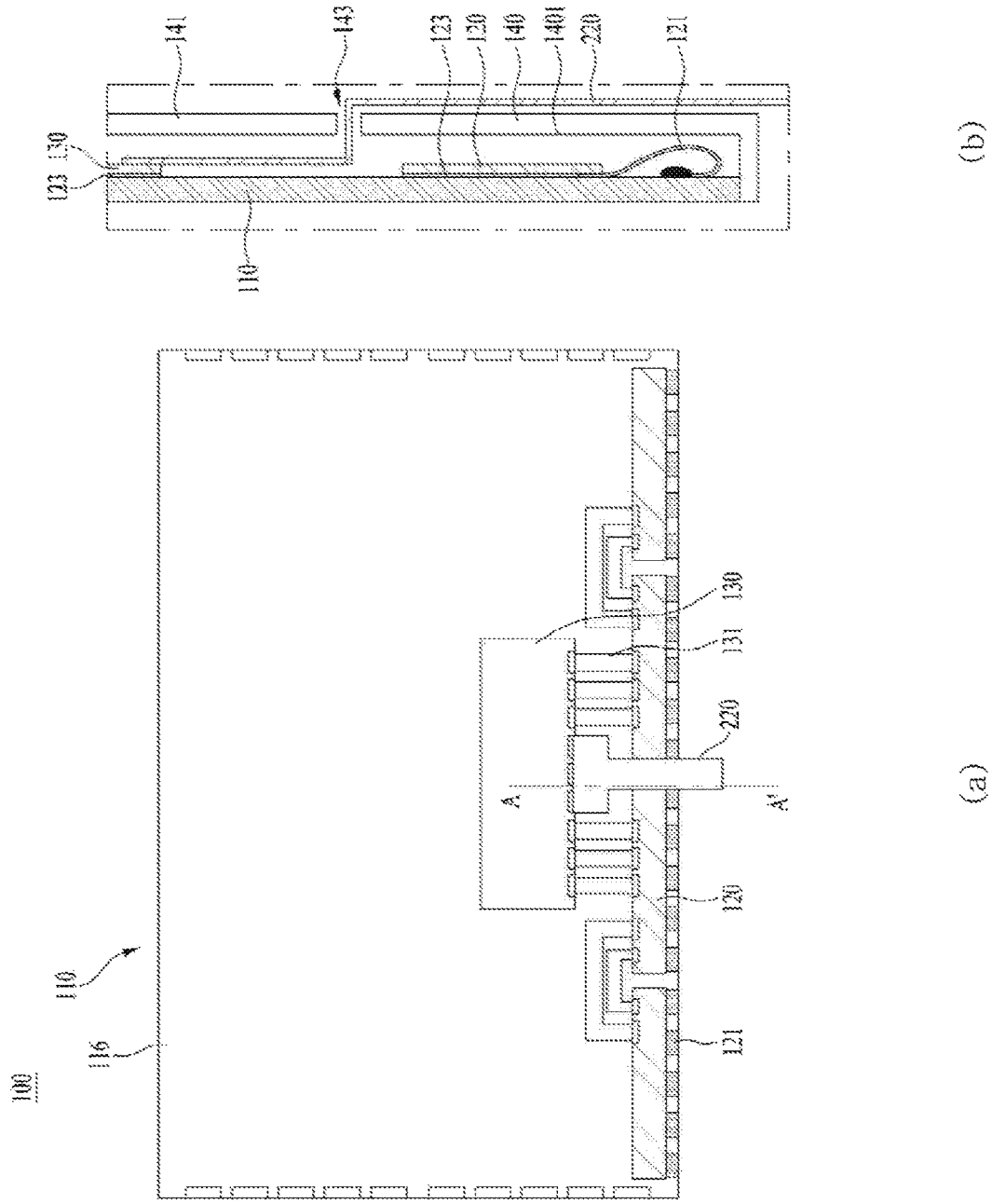
FIG. 8 includes a rear view of the display unit and a sectional diagram along A-A'.

FIG. 8 includes a rear view of the display unit 100 and a sectional diagram along A-A'.

For explanation sake about the inner structure, the rear view shows a state including no module cover 140 and the sectional view shows a state having the module cover 140.

The source PCB 120 may be located in a lower end of the rear surface of the display panel 110. An interface board 130 connected with the source PCB 120 may be located in an upper area of the source PCB 120 of the rear surface of the display panel 110.

The second cable 121 may connect a lower end of the source PCB 120 and a lower end of the display panel 110 with each other, using the forward bonding mentioned above.

The first cable 220 connected with the interface board 130 has to come out from one side of the display unit 100 to be connected with the AV box 210. Typically, the AV box 210 (shown in FIG. 2) is located under the display unit 100 so that the first cable 220 may come out from a lower end of the display unit 100.

The first cable 220 connected with the interface board 130 has to come out from one side of the display unit 100 to be connected with the AV box 210. Typically, the AV box 220 is located under the display unit 100 so that the first cable 220 may come out from a lower end of the display unit 100.

The first cable 220 may be exhausted from an outside, especially, an outer end of the display unit 100 via a hole 142 formed in the module cover 140. When the back cover 141 covers the hole 142, the first cable 220 may be exhausted from the outside, especially, the outer end of the display unit 100 via a slit 143 formed between the module cover 140 and a back cover 141 covering the hole 142 of the module cover 140.

As a result, the second cable 121, the module cover 140 and the first cable 220 are overlapped or the source PCB 120, the module cover 140 and the first cable 220 are overlapped. Such the structure may end up with the increase of the thickness. Especially, when the second cable 121 is connected by the forward bonding as mentioned above, the thickness of the display unit 100 may be increased more.

Figure 9:
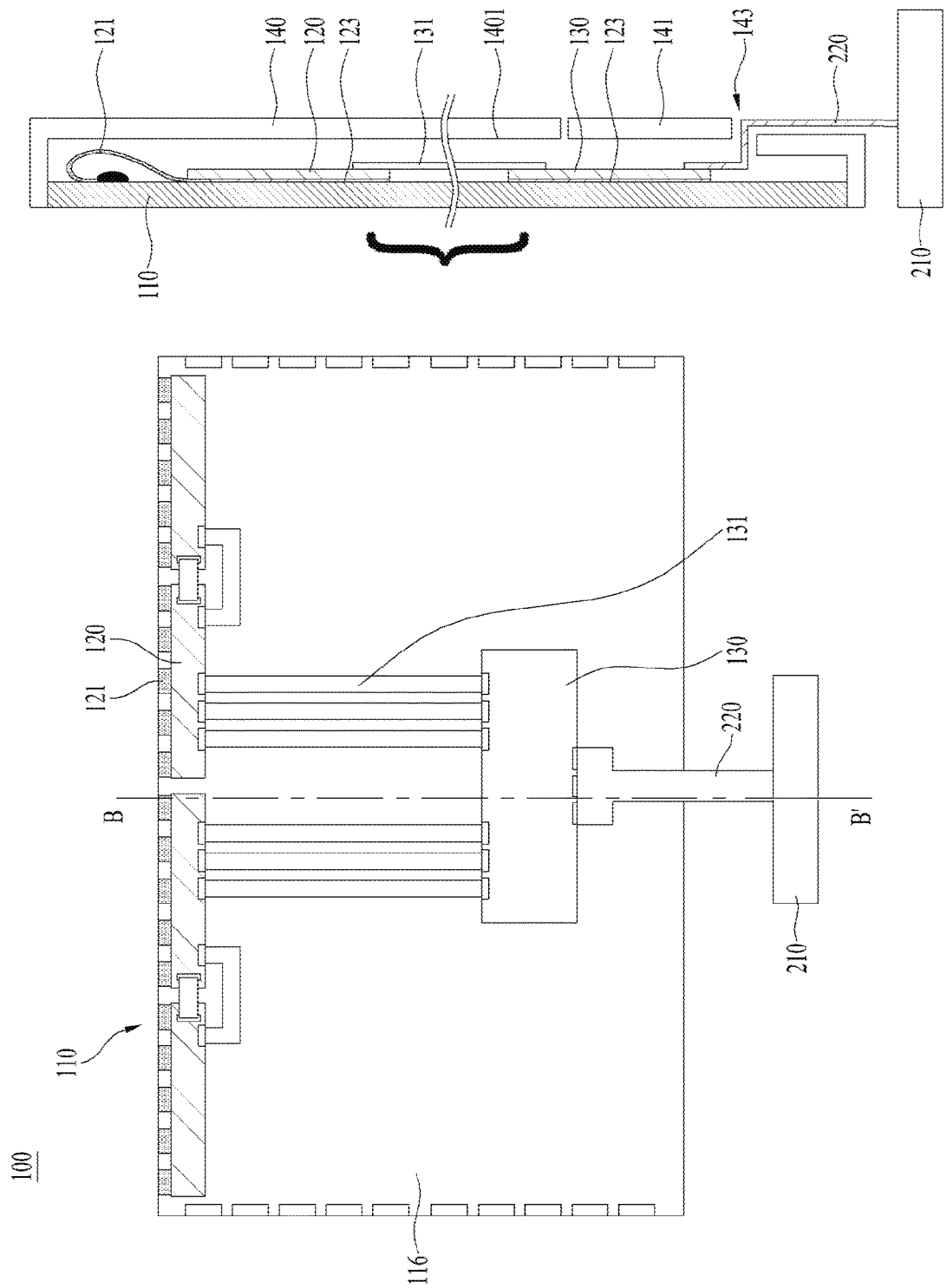
FIG. 9 includes a rear view of the display unit and a sectional diagram along B-B'.

FIG. 9 includes a rear view of the display unit 100 and a sectional diagram along B-B'.

Different from the arrangement shown in FIG. 8, the source PCB 120 may be located in an upper end of the display unit 100. In other words, the source PCB 120 may be provided in an upper end of the rear surface of the display panel 110 and the interface board 130 may be located in the rear surface of the display panel 110, under the source PCB 120.

The second cable 121 may be connected with the upper end of the display panel 110 and the upper end of the source PCB 120 by the forward bonding mentioned above.

The interface board 130 is connected with the source PCB 120 via the third cable 131. The third cable 131 may be connected to one side of the interface 130. Especially, the side may be an upper end of the interface board 130.

The first cable 220 may be connected with the other side of the interface board 130. The other side may be a lower end of the interface board 130. The first cable 220 connected with the other side of the interface board 130 may be drawn out from the lower end of the display unit 100 and connected with the AV box 210.

As shown in the rear view, the first cable 220 may not be overlapped with the source PCB 120 or itself in any areas.

Accordingly, the width between the rear surface of the display panel 110 and the inner surface of the module cover 140 may be uniformly distributed, so as to reduce the overall thickness of the display unit 100.

The module cover 140 may be configured to cover the rear surface of the display panel 110 as well as the area having the second cable 121 and the source PCB 120. To facilitate the connecting or disconnecting of the first cable 220 to or from the display unit 100, the module cover 140 may include an opening 142 for exposing at least predetermined area of the interface board 130 to the rear surface.

The back cover 141 may be provided to cover the opening 142 not to expose the rear surface of the interface board 130 to the rear surface of the display unit 100. In other words, even the connection area between the first cable 220 and the interface board 130 may be covered with the back cover 141 so as to define the clean exterior.

The first cable 220 may be drawn out from the lower end of the display unit 100 along the outside of the module cover 140 via the slit 143 formed between the module cover 140 and the back cover 141.

The increase of the thickness enabled by the arrangement shown in FIG. 9 may be on the premise that a virtual line of the first cable having a first width will meet the second cable 121 or the source PCB 120.

Accordingly, the arrangement divided along both directions of the source PCB 120 and the interface board 130 as shown in FIG. 9 may not only bring the minimized thickness but also simplify the shape of the module cover 140 and enhance the freedom of the arrangement.

Moreover, the first cable 220 and the second cable 121 or the first cable 220 and the source PCB 120 are spaced a preset distance apart from each other or not overlapped with each other, so that the heat generated from the components may be dispersed to the overall area of the display unit 100 enough to enhance the heat radiation efficiency.

Figure 10:
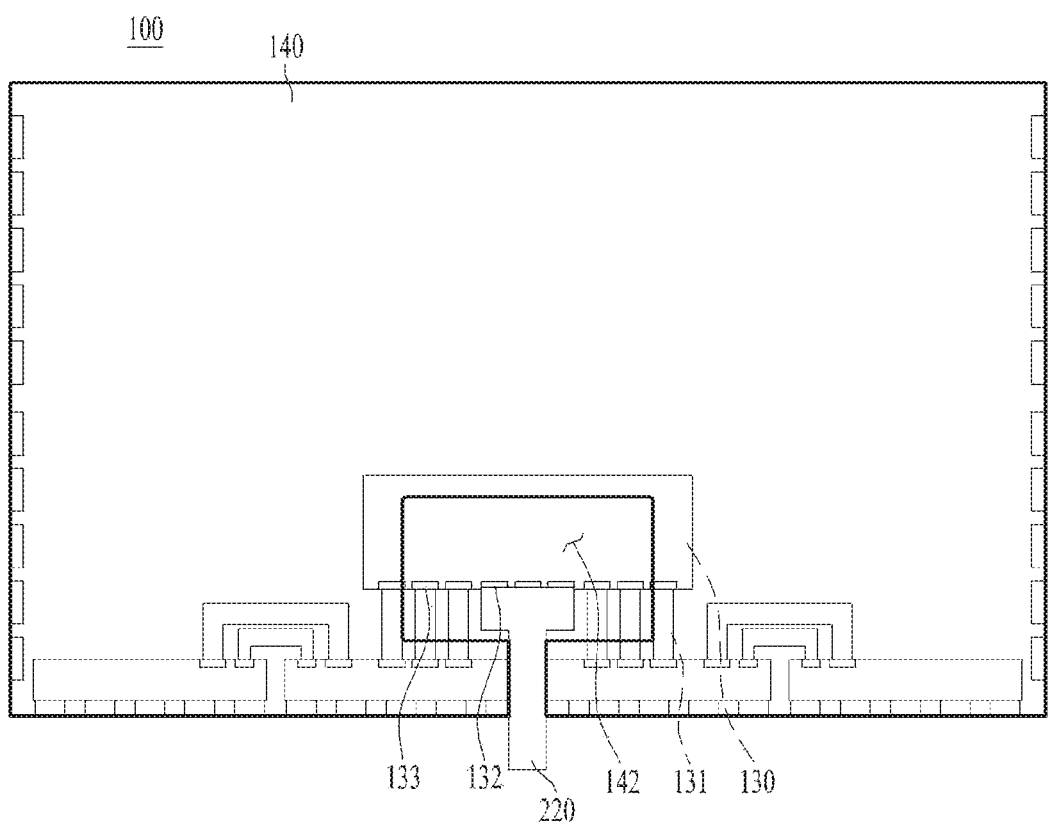
FIG. 10 is a rear view illustrating that the display unit shown in FIG. 8 includes a module cover.
Figure 11:
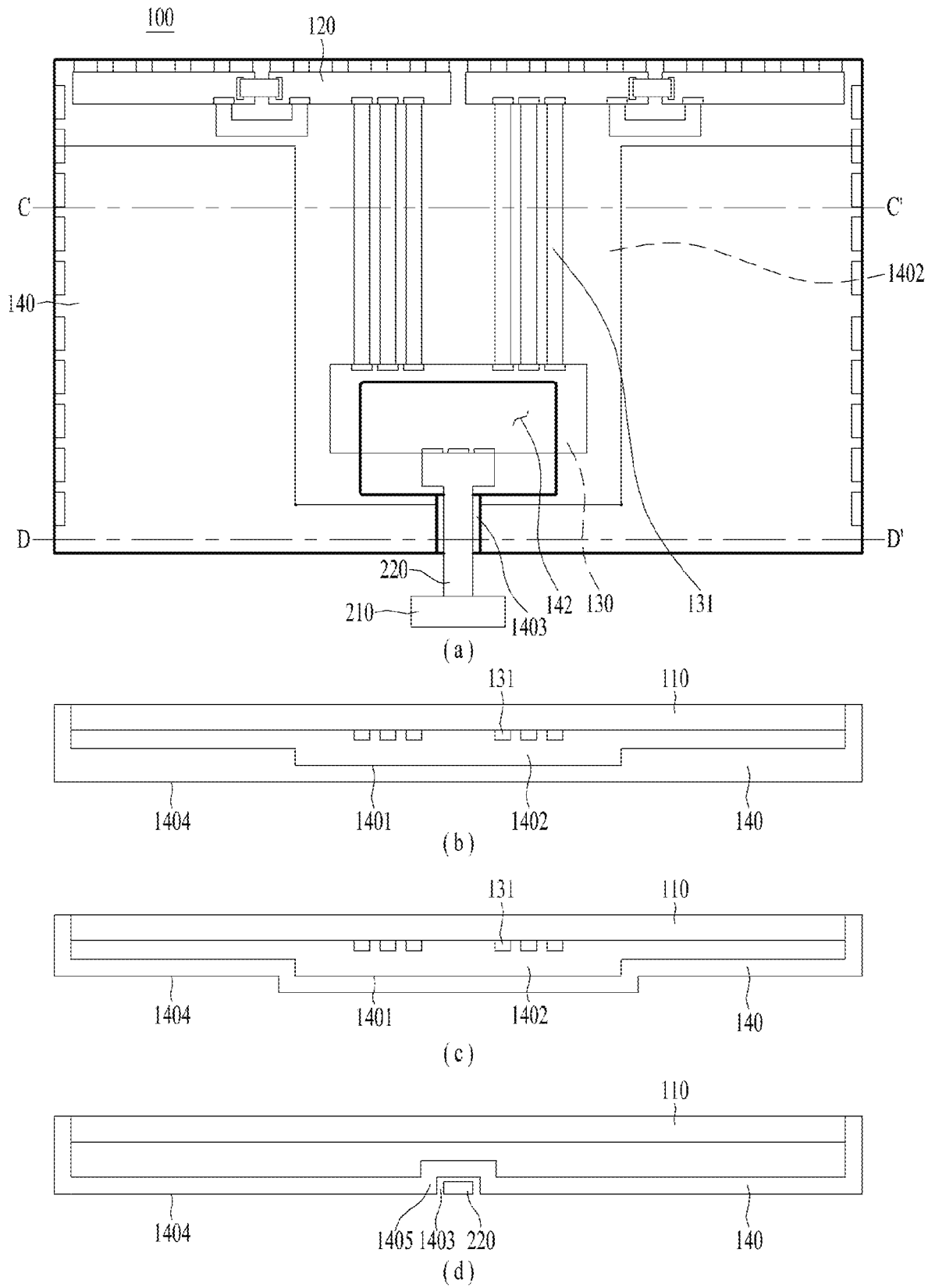
FIG. 11 is a rear view illustrating that the display unit shown in FIG. 9 includes the module cover.

FIG. 10 is a rear view illustrating that the display unit 100 shown in FIG. 8 includes the module cover 140 and FIG. 11 is a rear view illustrating that the display unit 100 shown in FIG. 9 includes the module cover 140.

Referring to FIG. 10, the hole 142 is configured to expose a first connection contact point 132 between the interface board 130 and the first cable 220. The hole 142 is configured to expose the third cable 131 and a second connection contact point 133 between the third cable 131 and the interface board 130 to the rear surface.

In contrast, referring to FIG. 11, the hole 142 is configured to expose only the first connection contact point 132 connecting the first cable 220 with the interface board 130, not the second connection contact point 133 connecting the third interface board 130 with the third cable 131. Accordingly, the exposure of the connection area between the cable and the interface which might be subject to the external force or shock can be minimized to enhance the reliability.

The third cable 131 may be also exposed via the hole 142 as shown in FIG. 10. However, the third cable 131 is not exposed in the embodiment shown in FIG. 11 so as to minimize the exposure area.

Figure 12:
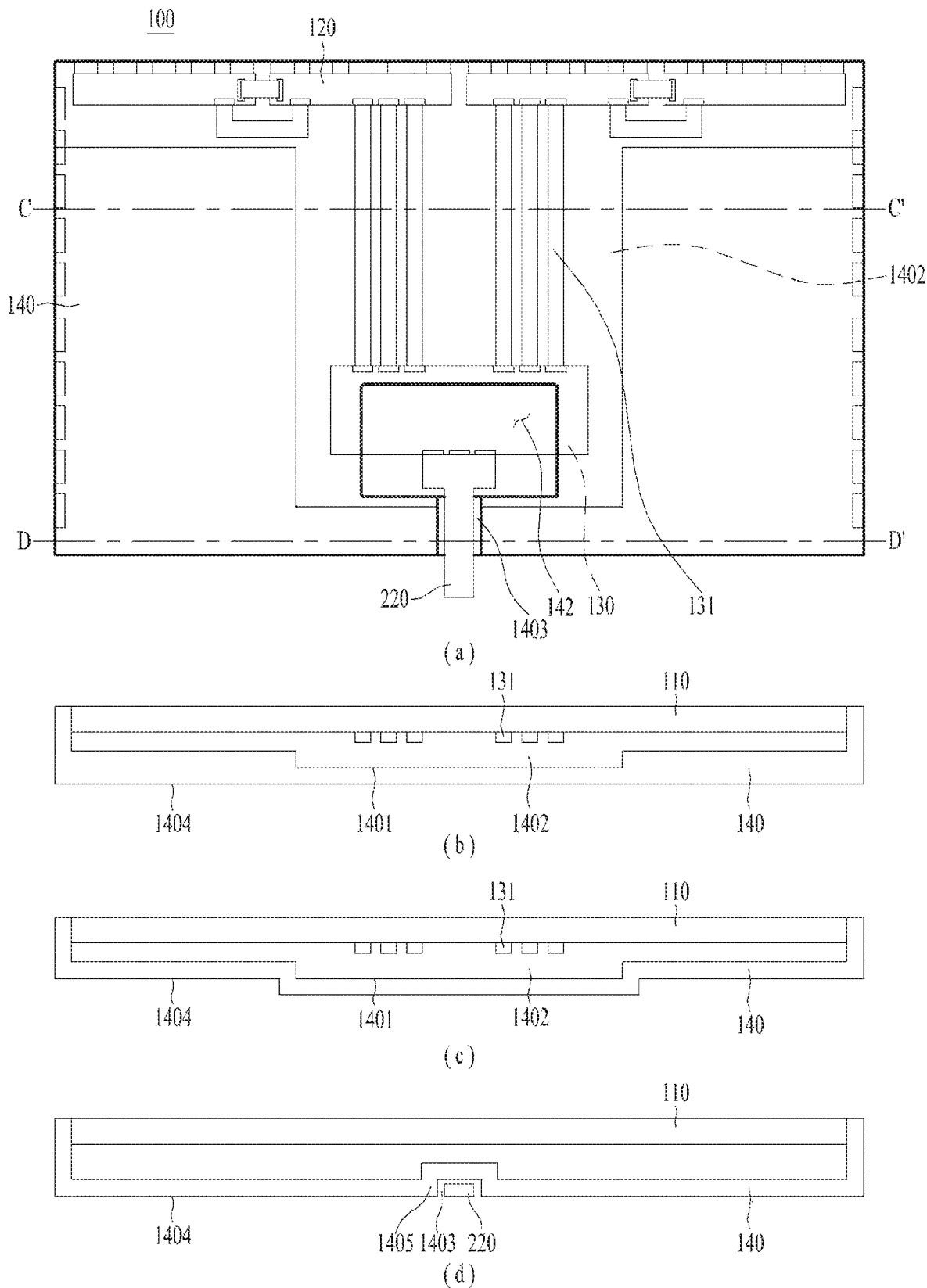
FIG. 12 includes a rear view and a sectional view of the display unit.

FIG. 12 includes a rear view and a sectional view of the display unit 100.

FIG. 12 (a) is a rear view of the display unit 100 in accordance with the present disclosure.

To minimize the increase of the thickness of the display unit 100, the inner surface 1401 of the module cover 140 may have a recessed area 1402 formed in a corresponding portion to the components provided in the rear surface of the display panel 110. The corresponding components may include the source PCB 120, the second cable 121, the interface board 130 and the like.

FIG. 12 (b) and FIG. 12 (c) are sectional views along C-C' direction shown in FIG. 12 (a).

As shown in FIG. 12 (b), the module cover 140 has the recessed area 1402 formed in the inner surface 1401 so that the overall rigidity thereof could be lowered but it has an outer surface 1404 which still has a flat shape so as to prevent the display unit 100 from becoming thick in the overall area. Moreover, the lowered rigidity of the recessed area may be compensated by the rigidity of the relatively thick module cover area.

As shown in FIG. 12 (c), the recessed area 1402 is formed while the overall area of the module cover 140 is uniformly thick. Accordingly, not only the inner surface 1401 but also the outer surface 1404 of the module cover 140 may have a curved shape. Such a shape may be realized by a forming, beading or pressing process, not the NC process, so as lower the production cost.

Compared with the embodiment shown in FIG. 12 (b), the thickest area of the display unit 100 may equal and the other area is thinner in the embodiment shown in FIG. 12 (c) enough to have versatility in the corresponding area.

FIG. 12 (d) is a sectional diagram of FIG. 12 (a) along D-D'.

The outer surface 1404 of the module cover 140 may have a recessed area 1403 which is recessed from the rear surface forwardly, corresponding to the first cable 220. The recessed area 1403 seems to accommodate the first cable 220 so that the first cable 220 can be arranged in the outer surface 1404 of the module cover 140 only to minimize the increase of the thickness. An outer peripheral area 1405 surrounds the first cable 220 so as to minimize the possibility of damage to the first cable 220 caused by the external force. Also, the possibility of drawing the first cable 220 connected with the interface board 130 out via the lower end of the display unit 100 may be provided (see FIG. 13).

Figure 13:
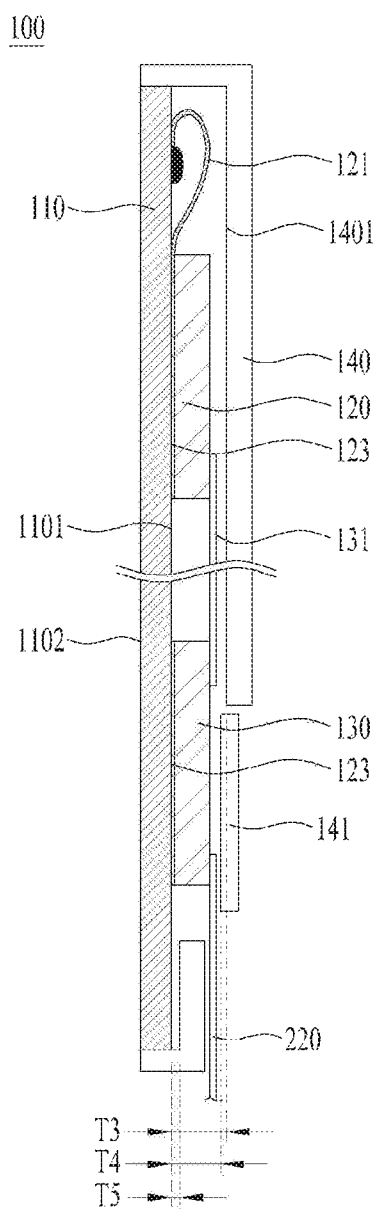
FIG. 13 is a vertically-cross sectional view illustrating one embodiment of a display unit.
Figure 14:
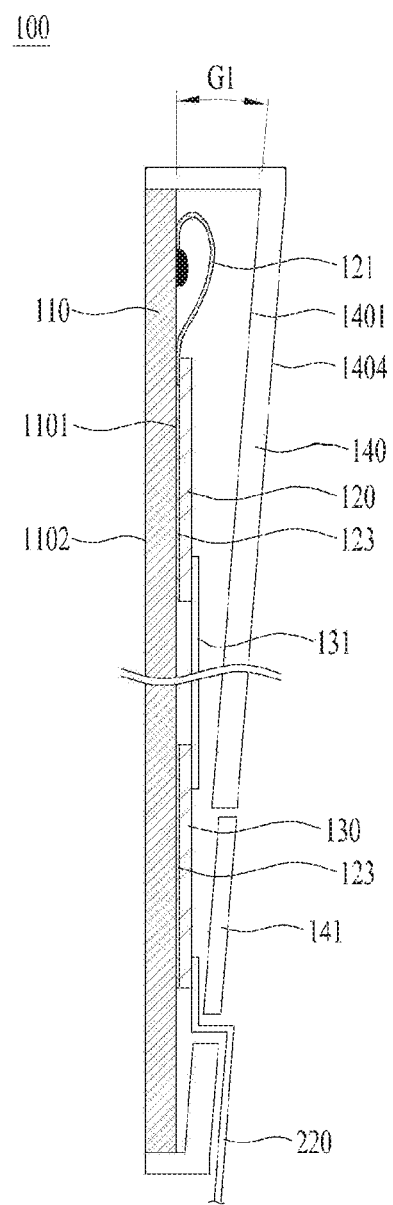
FIG. 14 is a vertically-cross sectional view illustrating another embodiment of a display unit.

FIGS. 13 and 14 are vertically-cross sectional views illustrating one embodiment of a display unit 100.

As shown in FIG. 9, the components provided in the rear surface of the display panel 110 are characterized in that they get thinner along a downward direction by the embodiment having the source PCV 120 provided above the rear surface of the display panel and the interface board 130 provided under the rear surface. Considering the characteristic, a different-thickness display unit 100 having the thickness between the rear surface of the module cover 140 and the front surface of the display unit 100 which gets lowered in a downward direction may be realized.

As shown in FIG. 13, the module cover 140 may have a step-like shape which gets more recessed downwardly. In other words, the module cover 140 may have a shape in which the gap between the inner surface of the module cover 140 and the rear surface 1101 of the display panel 110 becomes reduced from the upper end toward the lower end like T3, T4 and T5 sequentially.

In case the thickness of the module cover 140 is uniform, the outer surface 1404 of the module cover 140 may have a step-like shape of which the thickness gets more reduced downwardly.

Alternatively, as shown in FIG. 14, an inclined surface may be formed to make the display unit 100 become thinner and thinner downwardly. The inclined surface may have an inclination angle (G1). The inclination angle means the relation between the inner surface 1401 of the module cover 140 and the rear surface 1101 of the display panel 110. When the thickness of the display panel 110 is uniformly equal to that of the module cover 140, the thickness of the entire display unit 110, in other words, the front surface 1102 of the display panel and the outer surface 1404 of the module cover 140 may form the inclined surface.

When having the inclined surface, the display unit 100 may be inclinedly mounted in close contact with the wall. The slope of the rear surface of the module cover 140 with respect to the front surface of the display unit 100 is not so large. Even though the display unit is attached in close contact with the vertical wall 300, there is no big problem in the user's viewing.

Figure 15:
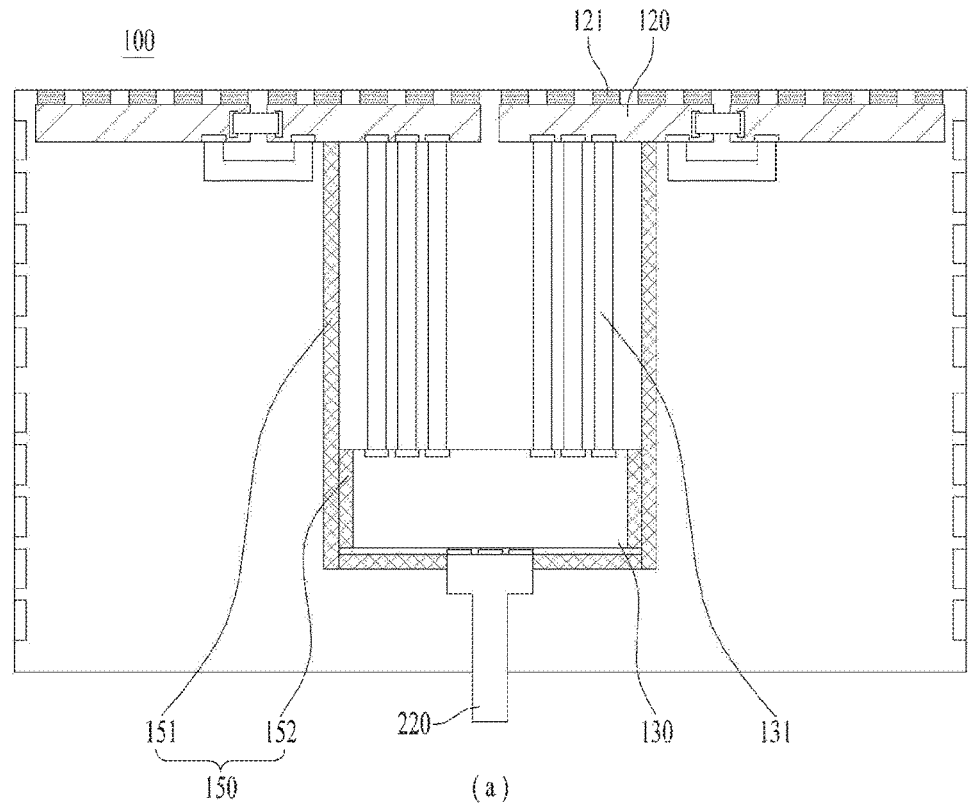
FIG. 15 is a rear view illustrating a further embodiment of a display unit.
Figure 15:
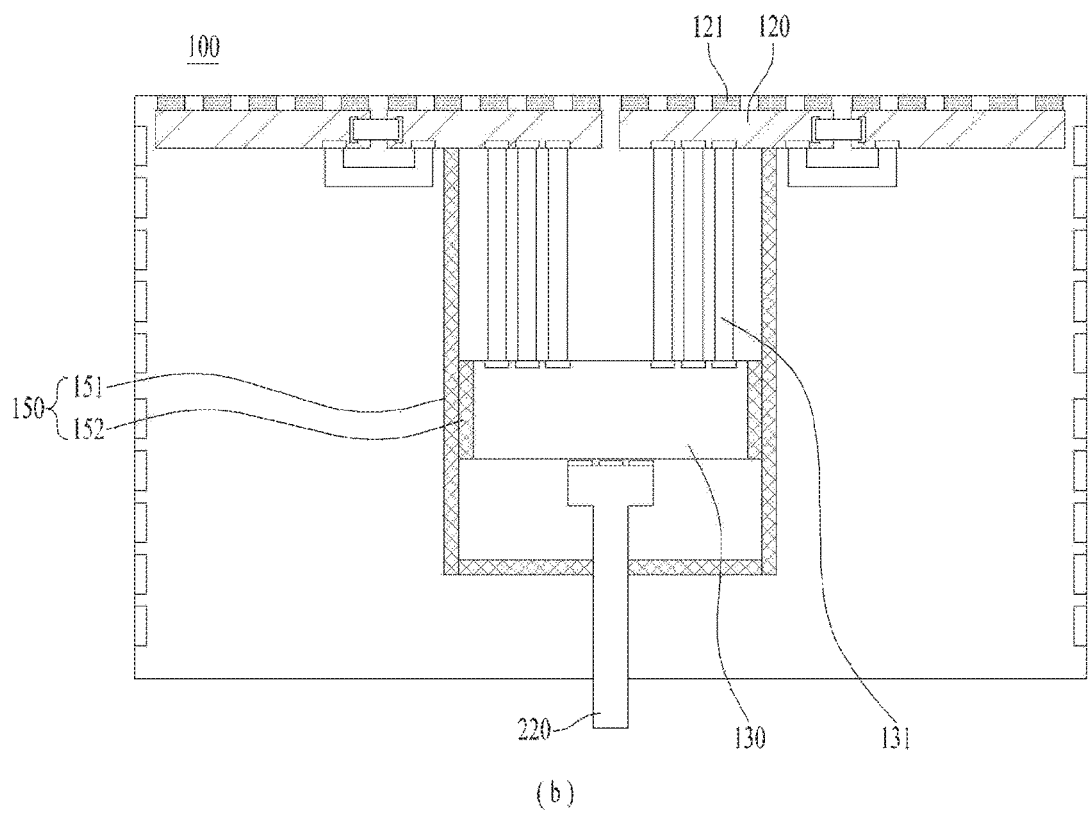

FIG. 15 is a rear view illustrating a further embodiment of a display unit 100.

The embodiment of the display unit may realize the structure configured to move the interface board 130 vertically to move in or out with respect to the display unit.

FIG. 15 (a) shows a state where the interface board 130 is moved to the lower end and FIG. 15 (b) shows a state where the interface board 130 is moved to the upper end.

As the source PCB 120 is located in the upper end and the interface board 130 in the lower end of the display unit 100, the vertically variable width of the interface board 130 becomes broad. Using that, the vertical location of the interface board 130 may be adjusted and the first cable 220 connected with the interface board 130 may be retractable with respect to the display unit 100 effectively.

When the relative distance between the AV box 210 (shown in FIG. 2) and the display unit 100 has to be fixed inevitably, the vertical location of the interface board 130 may be adjusted to prevent the first cable 220 exposed outside the display unit 100 from getting stretched long unnecessarily.

The interface board 130 may be movable along a rail 150 vertically. The rail 150 may hold both sides of the interface board 130 and the interface board 130 may be vertically sliding while being inserted in both sides of the rail 150.

Alternatively, the rail 150 may include a fixing portion 151 defining an entire passage; and a moving portion 152 moving along the fixing portion 151, so that the moving portion 152 may be fixed to both sides of the interface board 130 to move the interface board 130 there along. In this instance, the external shock or force applied to the interface board 130 may be minimized and damage to the interface board 130 may be prevented, compared with the moving structure configured to directly move the interface board 130.

The third cable 131 may be unwounded or spread or partially overlapped along the vertical movement of the interface board 130. However, the thickness of the third cable 131 is sufficiently thin by approximately 0.1 mm to secure a spare space even it is overlapped.

Figure 16:
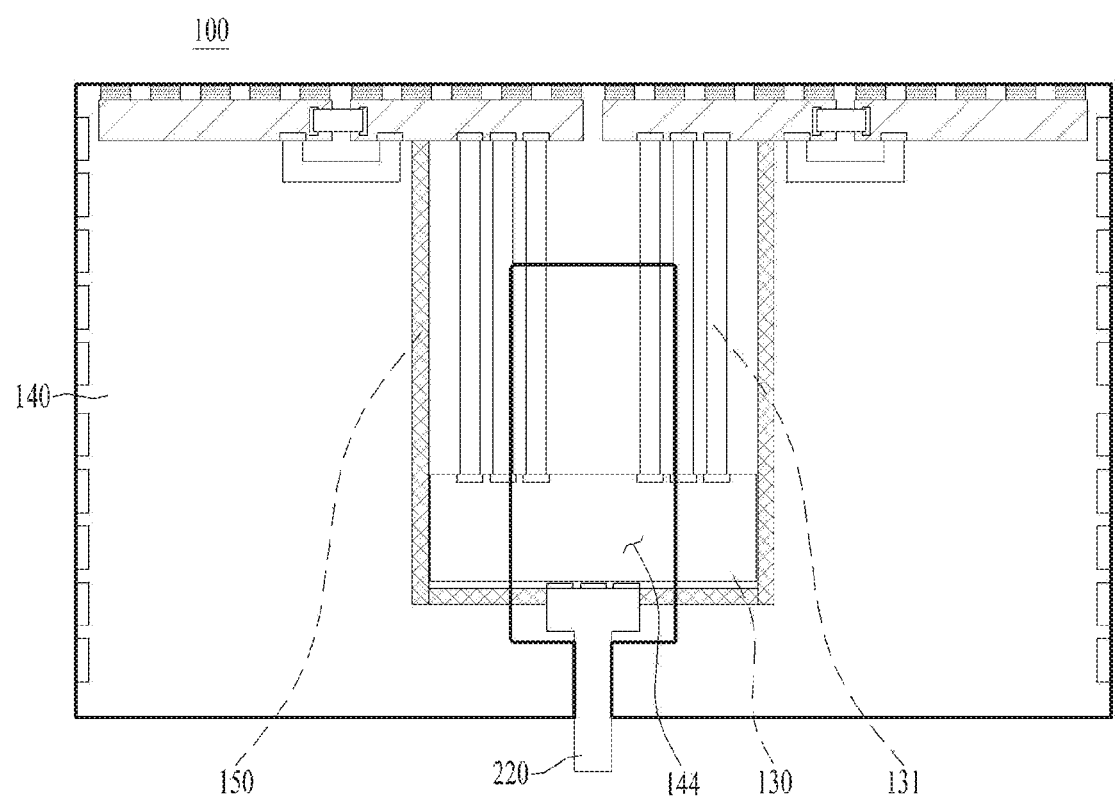
FIG. 16 is a diagram illustrating a rear surface of the display unit shown in FIG. 15.

FIG. 16 is a diagram illustrating the rear surface of the display unit 100 shown in FIG. 15.

Even in the embodiment that the interface board 130 is vertically movable, a longitudinally expanded open area 144 may be provided in the module cover 140 to expose the connection area between the interface board 130 and the first cable 220 sufficiently.

Various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds, are therefore intended to be embraced by the appended claims.

What is claimed is:

1. A display device comprising:
a display unit comprising a display panel;
an AV box configured to transceive signals with the display unit; and
a first cable configured to electrically connect the display unit with the AV box,
wherein the display unit comprises,
a source PCB provided in an upper end of a rear surface of the display panel;
a second cable configured to connect the upper end of the rear surface of the display panel with an upper end of the source PCB;
an interface board provided in a lower end of the source PCB and electrically connected with the source PCB;
a third cable configured to connect one side of the interface board with the source PCB; and
a module cover configured to cover the rear surface of the display panel, and
the first cable is configured to connect the other side of the interface board with the AV box,
wherein the module cover includes an opening corresponding to a connection point between the first cable and the interface board, wherein the display device further comprises a back cover to cover the opening, wherein an inner surface of the module cover includes a recessed area extending from a lower end of the opening to an upper end of the module cover, where the recessed area is configured to accommodate at least a portion of the first cable therein, wherein a slit is formed between the module cover and the back cover, the slit configured to allow the first cable to pass therethrough, and wherein the first cable extends from a bottom side of the display device through the slit to connect to the AV box.

2. The display device of claim 1, wherein the first cable is not overlapped with the source PCB in a direction along the thickness of the display unit.

3. The display device of claim 1, wherein the second cable is provided as COF (Chip On Film).

4. The display device of claim 1, wherein the first cable is not overlapped with the second cable in a direction along the thickness of the display unit.

5. The display device of claim 1, wherein one side of the second cable is connected with an upper end of the display panel and a predetermined region of the second cable is wound to connect the other side with the source PCB.

6. The display device of claim 5, wherein the display panel comprises,
   a transparent substrate;
   a first electrode provided in a rear surface of the transparent substrate;
   an organic light emitting layer provided in a rear surface of the first electrode; and
   a lower electrode provided in a rear surface of the organic light emitting layer,
   wherein the second cable is coupled to the rear surface of the transparent substrate.

7. The display device of claim 6, wherein the display panel further comprises,
   a metal sheet provided in the rearmost surface; and
   an adhesive material disposed between the source PCB and a rear surface of the metal sheet.

8. The display device of claim 1, wherein an inner surface of the module cover has a recessed area corresponding toe the source PCB, the second cable and the interface board.

9. The display device of claim 1, wherein the thickness of the display unit becomes reduced more and more toward the lower end.

10. The display device of claim 9, wherein an outer surface of the module cover has an inclined surface inclined with respect to a front surface of the display panel.

11. The display device of claim 9, wherein an outer surface of the module cover has a step-like shaped area recessed inwardly toward the lower end.

12. The display device of claim 1, wherein the AV box comprises,
   a controller;
   a main board in which the controller is loaded; and
   a power supply unit configured to supply an electric power.

* * * * *